(12) United States Patent
Amidon et al.

(10) Patent No.: US 7,360,137 B2
(45) Date of Patent: Apr. 15, 2008

(54) FLASH PROGRAMMER FOR PROGRAMMING NAND FLASH AND NOR/NAND COMBINED FLASH

(75) Inventors: Greg Amidon, Schaumburg, IL (US); Samil Asim Addemir, Naperville, IL (US); Greg Topham, Batavia, IL (US)

(73) Assignee: Westell Technologies, Inc., Aurora, IL (US)

( * ) Notice: Subject to any disclaimer, the term of this patent is extended or adjusted under 35 U.S.C. 154(b) by 85 days.

(21) Appl. No.: 11/453,661

(22) Filed: Jun. 15, 2006

(65) Prior Publication Data

US 2007/0258288 A1 Nov. 8, 2007

Related U.S. Application Data

(60) Provisional application No. 60/797,716, filed on May 4, 2006.

(51) Int. Cl.
*G01R 31/28* (2006.01)

(52) U.S. Cl. .................................. 714/736; 714/725

(58) Field of Classification Search ............... 714/736, 714/725, 726, 728, 733; 326/16
See application file for complete search history.

(56) References Cited

U.S. PATENT DOCUMENTS

| 4,939,694 | A | 7/1990 | Eaton et al. ............... 365/200 |
|---|---|---|---|
| 5,253,181 | A | 10/1993 | Marui et al. ............... 364/489 |
| 5,502,645 | A | 3/1996 | Guerra et al. .............. 364/489 |
| 5,640,337 | A | 6/1997 | Huang et al. .............. 364/578 |
| 5,794,007 | A | 8/1998 | Arrigotti et al. ............ 395/500 |
| 5,796,750 | A | 8/1998 | Lottridge et al. .......... 371/22.2 |
| 5,867,037 | A | 2/1999 | Capps, Jr. et al. ........... 326/38 |
| 5,991,907 | A | 11/1999 | Stroud et al. .............. 714/725 |
| 6,334,208 | B1 | 12/2001 | Erickson ..................... 716/17 |
| 6,414,871 | B1 | 7/2002 | Wirtz, II et al. ........ 365/185.01 |
| 6,437,587 | B1 | 8/2002 | Hartnett et al. ............. 324/755 |
| 6,622,272 | B1* | 9/2003 | Haverkamp et al. ......... 714/725 |
| 6,628,130 | B2 | 9/2003 | Williams et al. ............ 324/755 |
| 6,664,778 | B2 | 12/2003 | Jacobsen et al. .......... 324/158.1 |
| 6,820,244 | B2 | 11/2004 | Lincoln ......................... 716/4 |
| 6,839,873 | B1 | 1/2005 | Moore ........................ 714/725 |
| 6,851,013 | B1 | 2/2005 | Larsen et al. ............... 711/103 |
| 6,886,070 | B2 | 4/2005 | Stafford ..................... 711/103 |
| 6,912,601 | B1 | 6/2005 | Moore ......................... 710/10 |
| 6,959,256 | B2 | 10/2005 | Basto ......................... 702/117 |

(Continued)

OTHER PUBLICATIONS

Keahey, Julia Ann, "Programming of Flash with ICT Rights and Responsibilities," pp. 711-717, 2000 IEEE.

(Continued)

*Primary Examiner*—Vu A. Le
(74) *Attorney, Agent, or Firm*—McDonnell Boehnen Hulbert & Berghoff LLP

(57) ABSTRACT

A method and system for implementing NAND programming of flash devices during in-circuit testing is described. A flash programmer may receive a program file from an in-circuit tester and device information from a NAND flash device, including information regarding bad cells. The flash programmer converts the program file to account for the bad cells and then programs the NAND flash device with the converted program file. The ability of the flash programmer to translate between the in-circuit tester and a unit under test also allows for more efficient programming of other flash devices.

22 Claims, 4 Drawing Sheets

U.S. PATENT DOCUMENTS

| | | | | |
|---|---|---|---|---|
| 6,971,004 | B1 | 11/2005 | Pleis et al. | 713/100 |
| 6,988,232 | B2 | 1/2006 | Ricchetti et al. | 714/736 |
| 7,139,949 | B1* | 11/2006 | Jennion et al. | 714/726 |
| 2003/0084388 | A1* | 5/2003 | Williamson et al. | 714/725 |
| 2005/0251715 | A1* | 11/2005 | Loh et al. | 714/736 |

OTHER PUBLICATIONS

"Introduction to Flash Programming," Agilent 3070 / 79000 Flash programming Guide. Agilent Technologies 2001, pp. 1-1 to 1-20.

"ICT for the Widest Range of Production Challenges," Agilent Technologies, pp. 1-7, Feb. 15, 2005 www.agilent.com.

"In-Circuit Test," Agilent Technologies, printed Apr. 26, 2006 http://www.home.agilent.com/USeng/nav/-536886612.0/pc. html?PrinterFriendslyt=true.

"Spansion Flash Memory Design Tools, Innovative Tools and Resources to Reduce Time-to-Market," printed Apr. 26, 2006 http://www.spansion.com/support/hardware_development.html.

"Low Cost Board ATE On-Board Programming Enhances In-Circuit Test," printed Apr. 26, 2006 http://www.evaluationengineering.com/archive/articles/0698low.htm.

"S29GL-A MirrorBit Flash Family S29GL064A, S29GL032A, and S29GL016A 64 Megabit, 32 Megabit, and 16 Megabit 3.0-Volt only Page Mode Flash Memory Featuring 200 nm MirrorBit Process Technology," Spansion, Jan 11, 2006, Publication No. S29GL-A_00.

"Device Programmer is Automated Fits on Desk," dated May 22, 2006. www.eetimes.com.

* cited by examiner

# US 7,360,137 B2

FLASH PROGRAMMER FOR PROGRAMMING NAND FLASH AND NOR/NAND COMBINED FLASH

PRIORITY

The present patent application claims priority under 35 U.S.C. § 119(e) to U.S. Provisional Patent Application Ser. No. 60/797,716, which was filed May 4, 2006. The full disclosure of U.S. Provisional Patent Application Ser. No. 60/797,716 is incorporated herein by reference.

RELATED APPLICATIONS

This application is related to the following concurrently filed U.S. applications, which are incorporated by reference herein:
  U.S. patent application Ser. No. 11/453631; filed on Jun. 15, 2006, entitled "Programming Method for Write Buffer and Double Word Flash Programming," to Amidon et al.; and
  U.S. patent application Ser. No. 11/453632; filed on Jun. 15, 2006, entitled "Parallel Programming of Flash Memory During In-Circuit Test," to Amidon et. al.

FIELD

The present invention relates generally to programmable devices, and more particularly, relates to a flash programmer that can program NAND flash devices and NOR/NAND combined flash devices during in-circuit testing.

BACKGROUND

Manufacturers of high volume products have several options for programming programmable devices in a product. One option is to program the devices prior to assembling and soldering the devices to a printed circuit board (PCB). Another option is to program the devices after they are soldered to the PCB.

On board programming is generally more flexible due to the nature of programming the parts later in the manufacturing process. Less potential rework exists when the customization of the product occurs later in the process. Sending out programmable devices for programming can cause a two to ten day delay. This delay creates a need for up to ten days of pre-programmed devices on-hand. When a programming change occurs, all of the pre-programmed devices on-hand and in the pipeline require re-programming. Programming the devices on board reduces this two to ten day supply down to zero, reducing the need for re-programming to just the PCBs that are already produced, which would be required in either scenario.

There are several options for programming devices on board. A common method is to utilize an In-Circuit Tester (ICT) to download the code to the device. In a high volume-manufacturing environment, the time of download plus the actual ICT test time must be within the time requirements of the manufacturing process or a bottleneck in the process may form at ICT. Improvements to the flash programming speed may eliminate this bottleneck. Programming done within the required timeframe at the ICT is nearly free, while programming out of house or on separate platforms can be expensive. If the programming is done using the ICT, when in-circuit testing is already performed, the cost may be close to zero. The speed of programming is critical to obtaining this near zero cost.

ICTs typically use a vector processor for testing and programming. Essentially, the vector-based systems are good at "fixed" programming algorithms, but are unable to handle programming methods in which decisions are made on the fly. Unfortunately, these vector-based systems cannot program NAND flash devices or NOR/NAND combined flash devices. A NOR/NAND combined flash device includes both NOR features and NAND features. The combined flash technology goes by several commercial names, such as Spansion's ORNAND and Samsung's ONENAND.

Industry is increasingly using NAND flash devices due to its low cost, small package size, and larger capacity. Each NAND flash device is considered unique as each device typically has a unique set of bad cells. Thus, programmed NAND flash devices are not direct copies as data is stored in different "good" areas of the devices. A vector-based system cannot make the decisions necessary to adjust for the bad cell problem in NAND flash devices. As a result, NAND flash cannot be programmed by the ICT. The same holds true of the NOR/NAND combined technology due to its NAND features.

Therefore, a method for programming NAND flash devices and NOR/NAND combined flash devices during in-circuit testing would be beneficial.

SUMMARY

A method and system for programming NAND flash devices or NOR/NAND flash devices during in-circuit testing is described. The method for programming a NAND flash device or a NOR/NAND combined flash device during in-circuit testing includes receiving a program file for programming a flash device from an in-circuit tester, obtaining device information regarding the flash device to be programmed, including locations of bad cells in the flash device, converting the program file to account for the bad cells, and programming the flash device with the converted program file.

Obtaining device information may include reading a Manufacturing ID and a Device ID from the flash device. Additionally, obtaining device information may include communicating with the flash device over a multiplexed bus.

The bad cells include factory identified bad cells and cells that are damaged during the programming of the flash device. Converting the program file includes using a block move to move code to a good cell. The program file may be a Motorola S-Record formatted file, an Intel Hex formatted file, a binary formatted file, code image file, or any other appropriately formatted file.

The method may also include calculating Error Checking and Correction codes, notifying the in-circuit tester when the programming of the flash device is complete.

Additionally, a method for programming a device during in-circuit testing may include receiving code from an in-circuit tester having a first bus interface, receiving device information from a device to be programmed having a second bus interface, translating data between the first bus interface and the second bus interface, and programming the device based on the code received from the in-circuit tester and the device information received from the device to be programmed. The first bus interface is different from the second bus interface.

The device information includes a programming method to use for programming the device. The programming method may be word mode, double word mode, write buffer mode, page write mode, voltage acceleration mode, unlock bypass programming, and/or any additional appropriate programming mode.

Translating data between the first bus interface and the second bus interface may include translating between serial data and parallel data. The second bus interface may be an interface to a multiplexed bus. Additionally, the second bus interface is a proprietary interface and the code includes a device driver for the proprietary interface.

The method may also include programming multiple devices that are offset by at least one of an address line and a control line on a same unit under test, verifying that the device has been properly programmed, notifying the in-circuit tester when the device is programmed, performing a self-test, and erasing the device prior to programming the device.

A circuit located in a test fixture of an in-circuit tester for programming a flash device during in-circuit testing includes a first interface for communicating to the in-circuit tester, a second interface for communicating to a unit under test, wherein the flash device is located on the unit under test, memory that can be programmed by the in-circuit tester, and a microcontroller that executes machine language instructions stored in the memory, wherein the microcontroller is operable to translate between data received on the first interface and data received on the second interface.

The circuit may also include interface circuitry that translates a first voltage level received from a power supply to a second voltage level needed by the unit under test and an acceleration circuit that provides an acceleration voltage to the flash device for accelerated programming.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
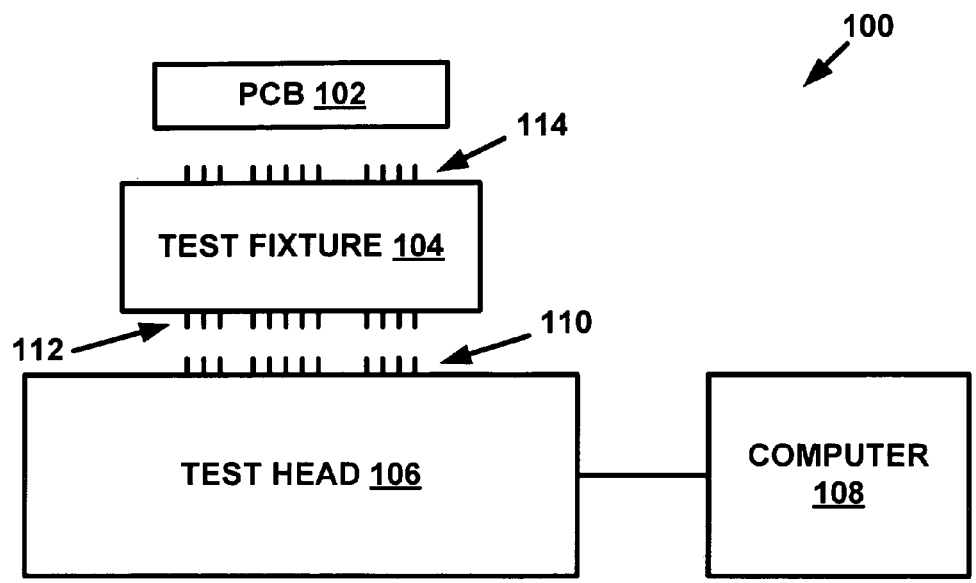
FIG. 1 is a block diagram of an in-circuit tester, according to an example.

FIG. 1 is a block diagram of an In-Circuit Tester (ICT) 100. As a non-limiting example, the ICT 100 may be an HP/Agilent 3070. Typically, the ICT 100 includes a test fixture 104, a test head 106, and a computer 108. The combination of the test head 106 and the computer 108 is referred to herein as the ICT machine. While FIG. 1 depicts the test head 106 and the computer 108 as stand-alone entities, the test head 106 and the computer 108 may be co-located.

The ICT 100 may be designed to test a printed circuit board (PCB) 102 or a circuit board panel that includes more than one PCB, such as the circuit board panel 200 described with reference to FIG. 2. The PCB 102 or the circuit board panel 200 may commonly be described as the unit under test (UUT) or the device under test (DUT). For example, the ICT 100 may test the PCB 102 or the circuit board panel 200 for shorts, opens, current draw, tolerances, and/or functionality. The test fixture 104 may be customized for each PCB design.

The computer 108 includes a processor, data storage, and machine language instructions stored in the data storage executable by the processor as is well known in the art. The computer 108 is not limited to having any particular type of processor, data storage, or instruction format. The computer 108 may select a test application dedicated to a particular type of circuit board design. Generally, the test application drives information to the test head 106.

The test head 106 receives the information from the computer 108 and responds by driving a number of test pins 110 on the test head 106, including those test pins 110 that provide data and address information to the test fixture 104. The test fixture 104 includes contacts 112 aligned with at least some of the test pins 110, which are routed to corresponding spring probes 114. The spring probes 114 are positioned in such a manner so that when the PCB 102 or the circuit board panel 200 is placed on the test fixture 104, the spring probes 114 establish contact with various test pads (not shown) located at a bottom surface of the PCB 102 or the circuit board panel 200. These test pads are routed to various pins of the components attached to the PCB 102 or the circuit board panel 200.

The processor in the computer 108 may be a vector processor, which facilitates testing the PCB 102 or the circuit board panel 200. The vector processor generates an input that is sent to the PCB 102 or the circuit board panel 200, and in response, the vector processor expects a particular output from the PCB 102 or the circuit board panel 200. If the vector processor receives the expected output, then that particular test pattern may be considered as a passing test. Otherwise, the vector processor may identify a test failure, which may indicate that there is a problem with the PCB 102 or the circuit board panel 200. While the vector processor provides efficient testing of the PCB 102 or the circuit board panel 200, this type of processor is unable to make a decision.

The ICT 100 may also be used to program memory components on the PCB 102 or the circuit board panel 200. For example, the ICT 100 may be used to program flash devices located on the PCB 102 or the circuit board panel 200. Generally, the ICT 100 sends programming commands to the flash device, applies the address and data to be programmed, and then polls to verify completion of the programming. Typically, each flash device type has specific instructions for programming that is provided to the ICT 100.

Figure 2:
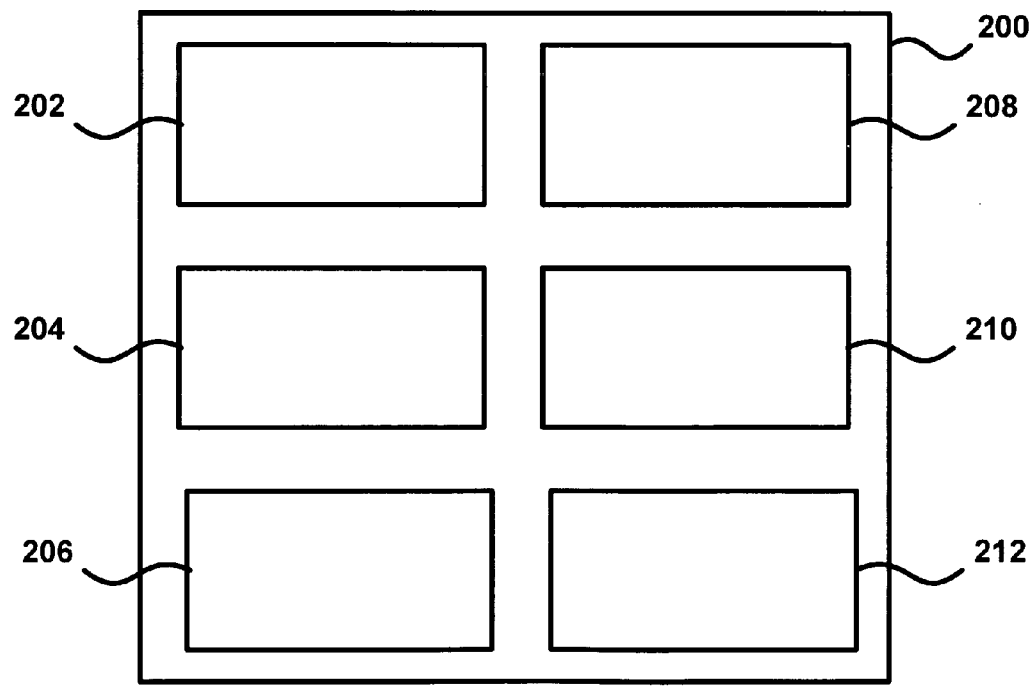
FIG. 2 is a block diagram of a circuit board panel, according to an example.

FIG. 2 is a block diagram of the circuit board panel 200. The circuit board panel 200 may include more than one PCB, such as PCBs 202-212. While the circuit board panel 200 is shown with six PCBs 202-212, the circuit board panel 200 may have more or less than six PCBs. The PCBs 202-212 are generally multiple instances of the same circuit manufactured as a panel of circuit boards for manufacturing efficiency. The PCBs 202-212 may be separated by cutting or breaking after manufacture and test, to provide separate products. For example, each of the PCBs 202-212 may be a modem board.

Figure 3:
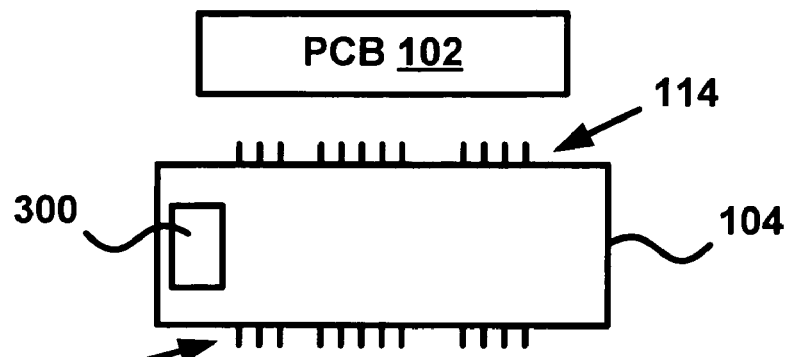
FIG. 3 is a block diagram showing a flash programmer located in a test fixture, according to an example.

FIG. 3 is a block diagram showing a flash programmer 300 located in the test fixture 104. The flash programmer 300 is a self-contained device having a small footprint, which allows the flash programmer 300 to be installed within the test fixture 104 with limited probe interference in the test fixture 104.

Alternatively, more than one flash programmer 300 may be located in the test fixture 104. The use of several flash programmers 300 may allow for even quicker programming of flash devices. While a typical ICT, such as the HP/Agilent 3070 can process up to four devices at a time, there is no limit, except for connection and/or space limitations in the test fixture 104, on the number of flash programmers 300 that may be implemented. For example, the test fixture 104 may have connection and space availability for 20-30 flash programmers 300.

The flash programmer 300 may be connected to the test fixture 104 using a standard connector; using either a direct connection or by wire wrapping to a probe socket in the test fixture 104; or using any other method for adding a circuit to the test fixture 104. Preferably, the test fixture 104 is designed to have an additional connector (not shown) that the flash programmer 300 can connect to. As a result, the flash programmer 300 may be described as a "plug-in" device, which may be easily inserted and removed from the test fixture 104 without impacting the operation of the ICT 100. The connector may be wired to the sockets that hold the spring probes 114, which are connected to the contacts 112 in the test fixture.

The flash programmer 300 may be capable of translating data between the ICT machine and the UUT. In addition to being able to process data in several formats, the flash programmer 300 may also be able to translate from one bus structure to another. As a result, the flash programmer 300 can program NOR flash, NAND flash, NOR/NAND combined flash and/or USB flash, using either a serial or parallel bus. Serial devices typically take longer to program than parallel devices clocked at the same speed. This difference in programming time is due to the clocking of serial data one bit at a time versus 16 or 32 bits at a time. For example, the ICT machine may transfer parallel data to the flash programmer 300, and the programmer 300 can program a serial device. The ICT machine is free to perform other operations while the flash programmer 300 programs the serial device.

Additionally, the flash programmer 300 supports PCM-CIA, CompactFlash, SmartMedia, Multimedia Card, Secure Digital, Memory Stick, USB, and memory key. Further, the flash programmer 300 supports various sizes of flash devices by using additional address lines as needed. Still further, the flash programmer supports fast writing modes, such as write buffer mode for Spansion devices, double word programming for ST devices, voltage accelerated programming, and unlock bypass programming to reduce total cycle count.

Figure 4:
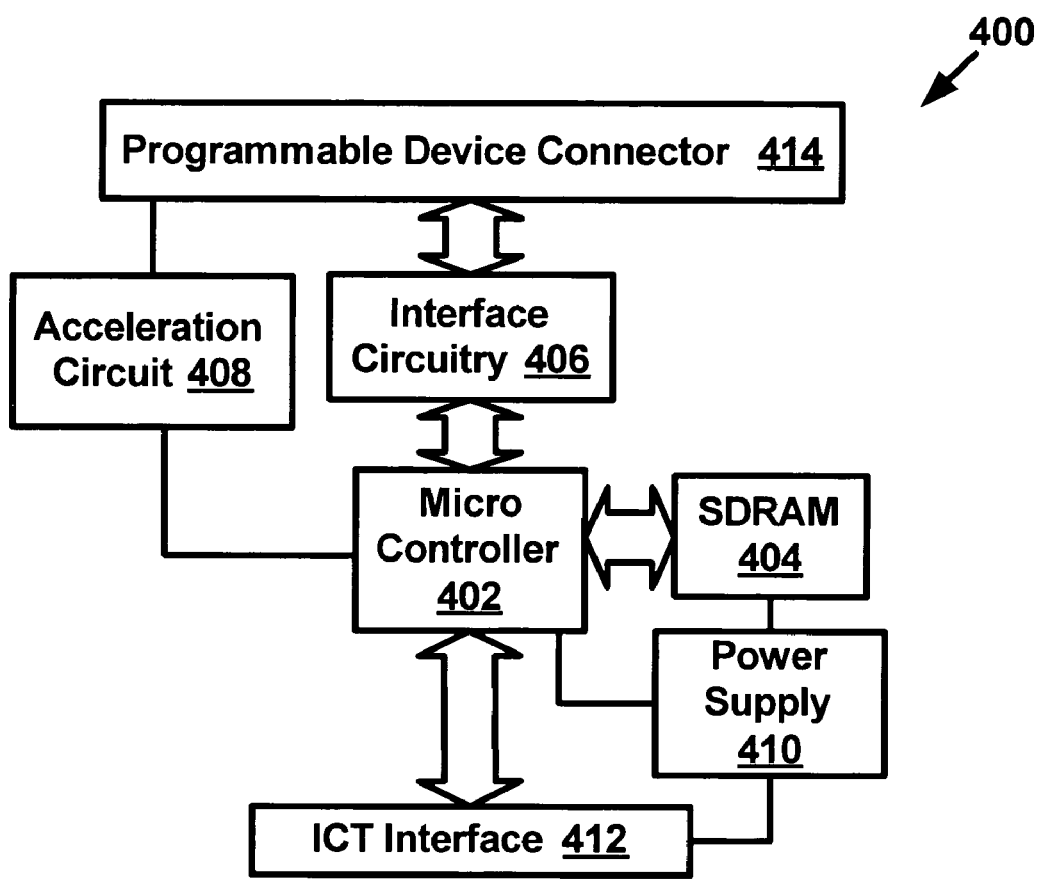
FIG. 4 is a block diagram of the flash programmer depicted in FIG. 3, according to an example.

FIG. 4 is a block diagram 400 of the flash programmer 300. The flash programmer 300 includes a microcontroller 402, memory 404, interface circuitry 406, an acceleration circuit 408, a power supply 410, an ICT interface 412, and a programmable device connector 414. The flash programmer 300 may have other components as well. Additionally, the flash programmer 300 may have a different design that provides substantially the same functionality.

The microcontroller 402 may execute machine language instructions stored in the memory 404. The microcontroller 402 is not limited to any particular device and may also be a microprocessor or any other device or combination of devices operable to process data. Preferably, the microcontroller 402 is a 32 bit, 100+ MIPS processor. The microcontroller 402 is preferably clocked with 50+ megahertz system clock to translate and process information, while still programming the UUT at "near" chip speeds.

The memory 404 may be any type of memory, including but not limited to the Synchronous Dynamic Random Access Memory (SDRAM) depicted in FIG. 4. The memory 404 may have sufficient storage for processing program files during translation. The code in the memory 404 may be updated and/or upgraded over time to fix bugs as well as to add new features and support for new devices.

For example, the ICT machine may update the code in the memory 404. The ICT machine interface may be multiplexed to allow the program code to be updated through the ICT machine. The ICT interface 412 within the flash device 300 may be an industry standard JTAG or Boundary Scan interface, and the ICT interface 412 may be multiplexed on the ICT machine interface when specific test modes are entered. The ICT interface 412 may then be exploited by the ICT machine to update the code in the memory 404. In this manner, the flash programmer 300 firmware may be updated without requiring removal of the flash programmer 300 from the test fixture 104.

The power supply 410 is typically 3.3 volts to supply the circuitry of the flash programmer 300 as well as supply voltage to the UUT as necessary. Obviously, the power supply 410 may provide other supply voltages. The acceleration circuit 408 may provide an acceleration voltage to an acceleration pin of the programmable device if the device supports high speed accelerated programming mode. The interface circuitry 406 may translate voltage levels to 3.3 volts, 1.8 volts, or other voltages needed at the UUT. The interface circuitry 406 may also buffer the micro-controller 402 from the UUT if necessary. The ICT interface 412 and the programmable device connector 414 provide connections to the test fixture 104 and the UUT, respectively.

The ICT machine disables the active devices on the UUT and transfers a programming file to the flash programmer 300. The ICT machine sends an industry standard Motorola S-Record format, Intel Hex record, binary, or other formatted file to the flash programmer 300. The microcontroller 402 is capable of parsing the file, verifying its contents, and then programming the UUT using the programming algorithm file for that device. The microcontroller 402 may program multiple flash devices that are offset by address or control lines on the same board.

The flash programmer 300 may program flash devices from either a parallel or serial interface. The flash programmer 300 may convert a parallel input into a serial stream for programming a serial device. Additionally, the flash programmer 300 may convert data and programming instructions in the parallel input, which may then be placed onto a multiplexed bus. For example, a multiplexed bus is typical on a NAND flash device in which the address and data lines are shared. In a similar fashion, the flash programmer 300 may also convert a serial input into a parallel stream for programming a parallel device, as well as convert the data and programming instructions in the serial input, which may then be placed onto a multiplexed bus.

The flash programmer 300 uses bus translating techniques to speed programming operations and/or to implement programming methods that the ICT machine is unable to implement due to its vector-based processing system. For example, the ICT machine is unable to program NAND flash devices. Each NAND flash device has its own unique pattern of bad cells and programming operations need to be designed to allow for these bad cells. Decisions must be made at run time to handle the bad cells and program the NAND flash device correctly. Vector-based systems are not capable of making decisions on the fly, and cannot program NAND flash devices. In addition, most NAND flash devices have a multiplexed address and data bus. While the ICT machine can be adapted to manage this multiplexed bus, it is much easier to implement a parallel interface to the ICT machine and a multiplexed interface at the flash programmer 300.

Figure 5:
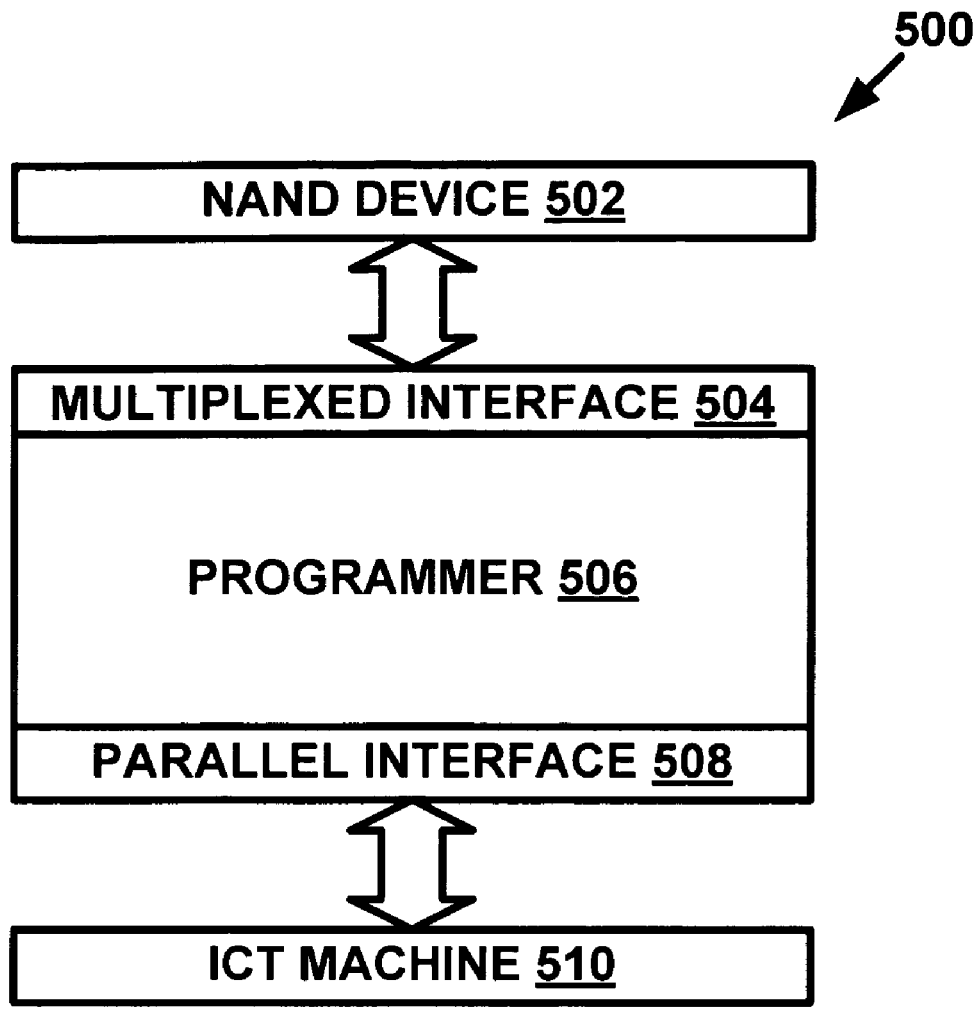
FIG. 5 is a block diagram that depicts programming of a NAND flash device during in-circuit testing, according to an example.

FIG. 5 is a block diagram 500 that depicts programming a NAND device 502 during in-circuit testing. In this example, a single module programmer 506 provides a parallel interface 508 to an ICT machine 510 and a multiplexed interface 504 to a NAND device 502. The programmer 506 is substantially the same as the flash programmer 300 and is located within the test fixture 104 of the ICT 100.

When the ICT machine 510 is ready to program the NAND device 502 with the programmer 506, the programmer 506 insulates the ICT machine 510 from the peculiarities of the NAND device 502. To allow for the bad cells in the NAND device 502, the programmer 506 presents a common interface to the ICT machine 510 that does not include this variability. As a result, the ICT machine 510 is unaware of the uniqueness of the NAND device 502.

The programmer 506 may communicate with the ICT machine 510 via the parallel interface 508. As a result, the transfer of the program file from the ICT machine 510 to the programmer 506 is not dependant on the NAND device 502 to be programmed. Instead, the programmer 506 identifies the NAND device 502 to be programmed. Typically, the identification is performed by reading the Manufacturing ID and the Device ID from the NAND device 502.

The NAND flash device 502 may use a multiplexed bus with data, commands, and addresses that are multiplexed on the same pins. The multiplexed bus provides a lower pin count than a standard parallel bus and does not require additional pins for address lines as the density of the device increases. The method of communicating to the multiplexed bus can vary from vendor to vendor.

The programmer 506 accounts for factory identified bad cells as well as any cells that go bad in use, such as during the programming operation, in the NAND device 502. The programmer 506 identifies the bad cells and moves the code to a good cell according to the specific requirements of the NAND device 502 as many different block move options are available. Two common block move options are "skip block" and "reserve block area". However, other block move options may be used.

The programmer 506 then obtains the program file from the memory 404 and converts the program file to programming instructions for the NAND device 502. The programmer 506 continues processing the program file until programming the NAND device 502 is complete. The programmer 506 may also calculate Error Checking and Correction (ECC) codes and program those as well. The specific ECC calculation may depend on the UUT hardware and software. The programmer 506 being software driven can implement many different algorithms and utilize the correct one as needed. Typically, the ECC data is written to a place within the NAND device 502 referred to as the spare cell array. The programmer 506 then communicates with the ICT machine 510 to indicate that the programming operation is complete.

The flash programmer 300 may also be useful for programming M-Systems Disk On Chip. The M-Systems Disk On Chip is a high-performance, single-chip flash disk that provides a full hard-drive emulator. The M-Systems Disk On Chip has NAND flash, memory, and a ASIC controller that implements a proprietary interface. This interface requires the use of M-Systems' firmware drivers to be incorporated into any device that intends to communicate with it. ICTs are not capable of implementing this type of driver. As a result, ICTs cannot program these devices.

By implementing the M-Systems' firmware drivers and providing a common interface to the ICT machine, the flash programmer 300 can translate the ICT interface to the M-Systems Disk On Chip interface, and enable programming of these devices at ICT. This technique is not limited to the M-Systems Disk On Chip, as the flash programmer 300 may implement this conversion for other types of devices for which firmware needs to be embedded.

Figure 6:
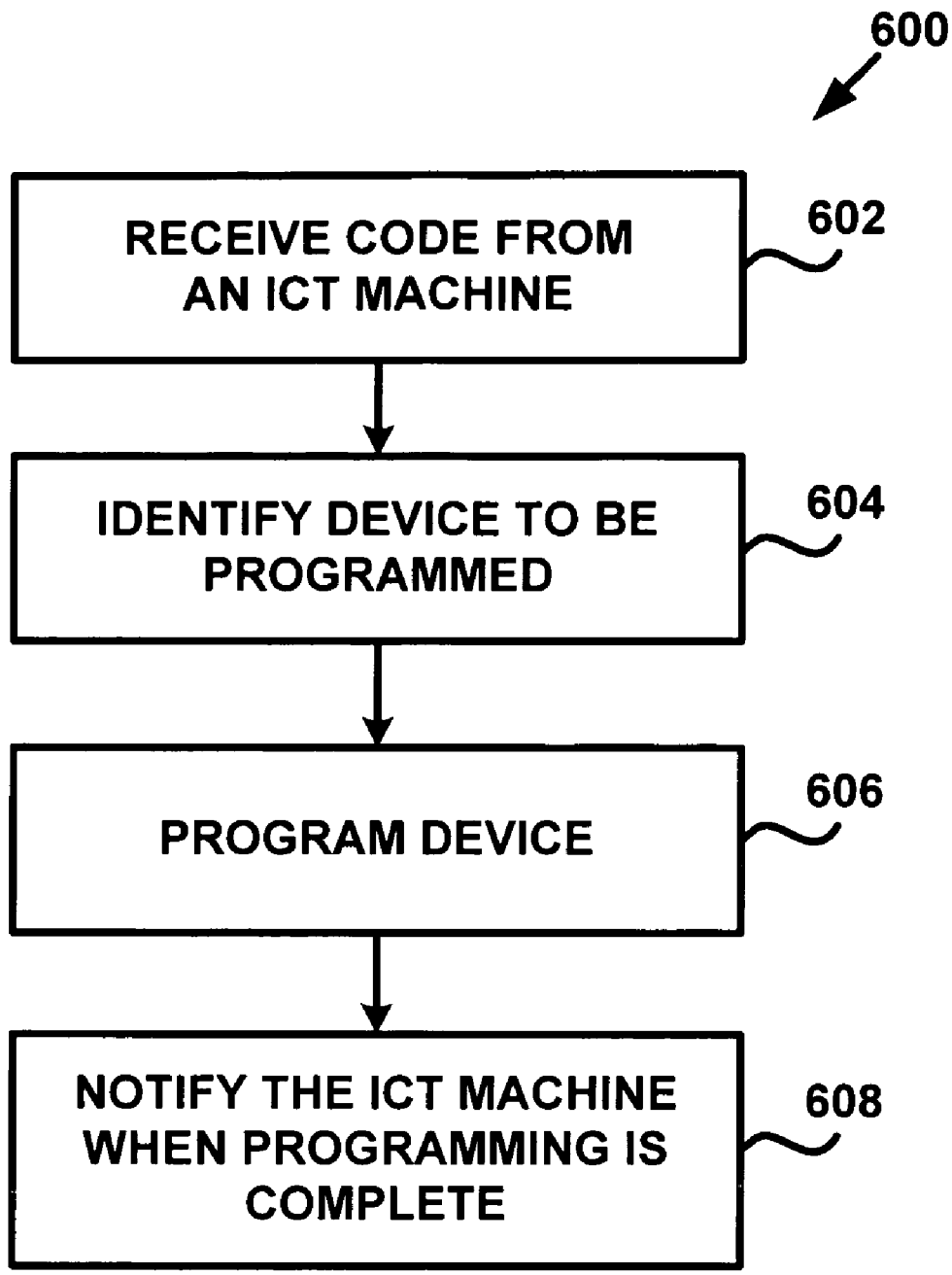
FIG. 6 is a flow diagram of a method for using the flash programmer depicted in FIG. 3, according to an example.

FIG. 6 is a flow diagram of a method 600 for using the flash programmer 300. At block 602, the flash programmer 300 receives a code file from the ICT machine. The ICT machine disables the active devices on the UUT and transfers a programming file to the flash programmer 300. The ICT machine sends an industry standard Motorola S-Record format, Intel Hex record, binary, or other formatted file to the flash programmer 300.

More specifically, the method 600 begins when the ICT machine asserts the Direct Memory Access (DMA) request signal. The microcontroller 402, upon receiving this signal, ensures that DMA is allowable. For DMA, there can be no active functions that require memory access or bus contention may result. To avoid bus contention, any running functions that require memory access need to be terminated or halted. Once the functions are terminated or halted, the microcontroller 402 can tri-state the memory bus and signal the DMA release pin. The ICT machine can transfer a file (e.g., Intel hex format, Motorola S-Record format, binary format) or code image to the memory 404 of the flash programmer 300.

When the ICT machine is done transferring the data, the ICT machine accesses the configuration portion of the memory 404 to configure the first address of data, last address of the data, type of data, and any other configurations needed. When complete, the ICT machine removes the DMA request signal and tri-states its memory bus. The flash programmer 300 can now re-take control of its memory bus and continue any halted operations.

The flash programmer 300 then waits for an ICT_PR (ICT Program Request signal) to signal that the test is ready for the flash device to be programmed. The flash programmer 300 also monitors a Test pin to determine if a test mode is enabled. If a test mode is selected, the flash programmer 300 implements the test mode selected. When returning from test mode, the flash programmer 300 re-enters the initial boot up mode.

At this point, the ICT machine is no longer needed to perform anything other than maintain power to the UUT. The ICT machine may begin working on the next available UUT in a panel, if any exist. By allowing the ICT machine to process additional units while the flash programmer 300 is working, the ICT testing is more efficient, resulting in reduced test time.

At block 604, the flash programmer 300 identifies the device to be programmed. When the ICT_PR signal line is driven high by the ICT machine, the flash programmer 300 disables DMA access and enables the flash device. Typically, the flash programmer 300 identifies the device to be programmed by reading the Manufacturing ID and the Device ID from the target flash device.

Depending on how the flash programmer 300 is configured, the method used to communicate to the target flash device may vary. When the target flash device has a serial, multiplexed, or parallel interface, the flash programmer 300 uses that topology to transfer and receive data to and from the target flash device. The type of bus to which the UUT is connected is not always the same as the interface to the ICT machine.

The flash programmer 300 provides a hardware interface for the two busses and the software is capable of communicating with either bus. Preferably, the flash programmer knows the type of bus on the UUT side based on a configuration bit or jumper setting. The software then implements a multi-step access mode of a multiplexed bus, or a direct access mode of a serial or parallel bus.

Generally a parallel bus on the ICT side is preferred for speed of access reasons. The type of flash device connected to the UUT dictates the bus type on the UUT side. Since the software in the flash programmer 300 is tied to a hardware layout of the two busses, it is not necessary to program all bus translation software possibilities in the memory 404. The software can also accommodate a hybrid of two or more bus possibilities.

The flash programmer 300 also determines what command formats and responses are expected as well. The flash programmer 300 is capable of communicating with many different types of flash devices. Additionally, if the flash programmer 300 is unable to communicate with a particular flash device, the flash programmer 300 may be re-programmed as described with respect to FIG. 4. Configuration jumpers and/or bits may be used to aid the flash programmer 300 for communicating with various flash devices.

The Manufacturing ID and the Device ID may also be used to determine what flash algorithm is be used to program the device at block 606. The flash programmer 300 may use internal lookup tables to determine which programming method is used to program the device identified. The internal lookup tables may be stored in the memory 404. When a vendor provides more than one programming method to program a flash device, the flash programmer 300 may select the fastest, most reliable method to program that flash device. Additionally, the flash programmer 300 may identify whether to use voltage acceleration in conjunction with the programming method selected.

At block 606, the flash programmer 300 programs the flash device using the selected programming method. The flash programmer 300 checks that the flash device is blank (i.e., all cells are verified to be 0xFF). If the flash device is not blank, the flash programmer 300 erases the flash device. Once the flash device is blank, the flash programmer 300 begins programming the flash device using the programming method selected at block 604. Some non-limiting examples of programming methods are described as follows.

Word mode programming is the basic programming algorithm for flash devices.

This is the standard four-cycle, single word write method of programming. For example, Sharp devices and several other flash manufacturers use this programming mode. A word is read from the file in the memory 404. If the word is 0xFF, then the next word is read. The program continues to read until there is a non-0xFF value in the memory 404, and then that value is written to the flash device.

Double word mode is available for ST devices as long as the voltage acceleration is also allowed. If the voltage acceleration is not allowed, standard word mode programming is used for programming ST devices. Two words are read from the file in the memory 404. If both words are 0xFFFF, then the next two words are read. The program continues to read until there is at least one word that is a non-0xFF value in the memory 404. The two words are then written to the flash device.

Spansion MirrorBit™ devices may use a write buffer mode. This programming mode takes data 32 bytes at a time and programs them to the flash device. Sixteen words are read from the memory 404. If all of the words are 0xFFFF, then the next sixteen words are read. The program continues to read until there is at least one word that is a non-0xFF value from the memory 404. The sixteen words are then written to the flash device.

Many NAND flash devices and NOR/NAND combined flash devices implement a Page Write Mode. Typically, the Page Write Mode is a 528 byte write mode (512 byte cell array and 16 bytes in the spare cell array). Additionally, some large NAND flash devices implement the Page Write Mode with 2112 byte writes (2048 bytes in the cell array and 64 bytes in the spare cell array). Other page sizes may be implemented as well.

Additionally, NAND flash devices may utilize specific programming routines that may be unique to that device. The M-Systems driver is needed to communicate with the M-Systems Disk On Chip. NOR/NAND combined flash devices may also be implemented with integrated drivers. As with the M-Systems driver, vendor specific software drivers can also be implemented in firmware if necessary to properly program these devices. Programming the NAND flash devices and the M-Systems Disk On Chip was previously described.

At block 608, the flash programmer 300 notifies the ICT machine that the flash device is programmed. Before providing notification to the ICT machine, the flash programmer 300 may verify that the flash device was properly programmed. There are at least two methods of verification available. In one method, the flash programmer 300 performs a word for word comparison against the contents of the file in the memory 404. Each word is read and compared from the file in the memory 404 to the flash device. If every word is the same, the verification passes.

In another method, the flash programmer 300 performs a checksum verification. The checksum for the file in the memory 404 is calculated as each read from the memory 404 is performed during programming. The checksum for the flash device is calculated by reading the flash device. If the two checksums are the same, the verification passes.

Once verification is complete, the flash programmer 300 provides the "program complete" and the "pass-fail" status to the ICT machine. This may be accomplished by driving a Pass-Fail line high and a Program Complete line high. If verification fails, the Pass-Fail line may be driven low, while the Program Complete line is driven high.

Additionally, special test modes may be used to verify the hardware of the flash programmer 300 (i.e., a self test), as well as to enable software upgrades. An example test program is described as follows. To toggle the various test modes, the data pins are set to the value of the test and the test pin is pulled high. After bringing the test pin low and all the data lines to tri-state, the selected test begins. The Pass-Fail line toggles indicating that the flash programmer 300 detected the test mode command. The test mode ends when the test mode pin is pulled high and low with all the data lines low. The Pass-Fail line toggles indicating that the flash programmer 300 detected the test mode exit command.

Example test modes include:

0x01—Address lines are toggled high and then low one at a time from A0 to A26. This continues until the Test mode line is pulled high and then low.

0x02—Data lines are toggled high and then low one at a time from D0 to D16. This continues until the Test mode line is pulled high and then low.

0x03—The control lines are toggled high and low continuously all at the same time. This continues until the Test mode line is pulled high and then low.

0x04—The SDRAM is written to and read across all data and address lines. This continues until the Test mode line is pulled high and then low.

0x05—The UUT flash Manufacturing ID is read and reported on the Data lines. This continues until the Test mode line is pulled high and then low.

0x06—The UUT flash Device ID is read and reported on the Data lines. This continues until the Test mode line is pulled high and then low.

0x07—The UUT flash blank check is performed. The data line will all be high if it is blank, low if it is not blank. This continues until the Test mode line is pulled high and then low.

0x08—The UUT flash device is erased. The data line will all be high if it successfully erased, low if it is not erased. This continues until the Test mode line is pulled high and then low.

0x09—The DMA line for the system memory is enabled. The control, address, and data lines are tri-stated from the microcontroller. The ICT machine can now interface directly with the SDRAM. This continues until the Test mode line is pulled high and then low.

0x0A—The UUT flash is programmed using the file stored in memory. The pass fail line will indicate the status of the programming and the program done goes high when programming is complete. This continues until the Test mode line is pulled high and then low.

0x10—The boundary scan pins are put onto the bus and the microcontroller can be upgraded. This continues until the Test mode line is pulled high and then low.

As described, the flash programmer 300 translates data in several formats between different bus structures to program flash devices with a variety of different programming algorithms. As a result, the flash programmer 300 can program NOR flash, NAND flash, NOR/NAND combined flash, and/or USB flash, using either a serial, parallel, or multiplexed bus. The flash programmer 300 supports PCMCIA, CompactFlash, SmartMedia, Multimedia Card, Secure Digital, Memory Stick, USB, and memory key. Further, the flash programmer 300 supports fast writing modes, such as write buffer mode for Spansion devices, double word programming for ST devices, voltage accelerated programming, and unlock bypass programming to reduce total cycle count. Thus, the flash programmer 300 may reduce programming times and manufacturing costs.

It should be understood that the illustrated embodiments are examples only and should not be taken as limiting the scope of the present invention. For example, while the flash programmer 300 has been described herein with reference to the HP/Agilent ICT, the flash programmer 300 can be implemented with other ICTs, such as the ICTs manufactured by Teradyne, Genrad, and others. The claims should not be read as limited to the described order or elements unless stated to that effect. Therefore, all embodiments that come within the scope and spirit of the following claims and equivalents thereto are claimed as the invention.

We claim:

1. A method for programming a NAND flash device or a NOR/NAND combined flash device during in-circuit testing, comprising in combination:
   receiving a program file for programming a flash device from an in-circuit tester;
   obtaining device information regarding the flash device to be programmed, including locations of bad cells in the flash device;
   converting the program file to account for the bad cells; and
   programming the flash device with the converted program file.

2. The method of claim 1, wherein obtaining device information includes reading a Manufacturing ID and a Device ID from the flash device.

3. The method of claim 1, wherein obtaining device information includes communicating with the flash device over a multiplexed bus.

4. The method of claim 1, wherein the bad cells include factory identified bad cells and cells that are damaged during the programming of the flash device.

5. The method of claim 1, wherein converting the program file includes using a block move to move code to a good cell.

6. The method of claim 1, further comprising calculating Error Checking and Correction codes.

7. The method of claim 1, further comprising notifying the in-circuit tester when the programming of the flash device is complete.

8. The method of claim 1, wherein the program file is a file having a format selected from the group consisting of Motorola S-Record format, Intel Hex format, binary format and code image.

9. A method for programming a device during in-circuit testing, comprising in combination:
   receiving code from an in-circuit tester having a first bus interface;
   receiving device information from a device to be programmed having a second bus interface, wherein the first bus interface is different from the second bus interface;
   translating data between the first bus interface and the second bus interface; and
   programming the device based on the code received from the in-circuit tester and the device information received from the device to be programmed.

10. The method of claim 9, wherein translating data between the first bus interface and the second bus interface includes translating between serial data and parallel data.

11. The method of claim 9, wherein the second bus interface is an interface to a multiplexed bus.

12. The method of claim 9, wherein the second bus interface is a proprietary interface and the code includes a device driver for the proprietary interface.

13. The method of claim 9, further comprising programming multiple devices that are offset by at least one of an address line and a control line on a same unit under test.

14. The method of claim 9, further comprising verifying that the device has been properly programmed.

15. The method of claim 9, further comprising notifying the in-circuit tester when the device is programmed.

16. The method of claim 9, further comprising performing a self-test.

17. The method of claim 9, wherein the device information includes a programming method to use for programming the device.

18. The method of claim 17, wherein the programming method is selected from the group consisting of word mode, double word mode, write buffer mode, page write mode, voltage acceleration mode, and unlock bypass programming.

19. The method of claim 9, further comprising erasing the device prior to programming the device.

20. A circuit located in a test fixture of an in-circuit tester for programming a flash device during in-circuit testing, comprising in combination:
- a first interface for communicating to the in-circuit tester;
- a second interface for communicating to a unit under test, wherein the flash device is located on the unit under test;
- memory that can be programmed by the in-circuit tester; and
- a microcontroller that executes machine language instructions stored in the memory, wherein the microcontroller is operable to translate between data received on the first interface and data received on the second interface.

21. The circuit of claim 18, further comprising interface circuitry that translates a first voltage level received from a power supply to a second voltage level needed by the unit under test.

22. The circuit of claim 18, further comprising an acceleration circuit that provides an acceleration voltage to the flash device for accelerated programming.

* * * * *